(12) United States Patent
Larson et al.

(10) Patent No.: US 7,691,475 B2
(45) Date of Patent: Apr. 6, 2010

(54) ANISOTROPIC CONDUCTIVE ADHESIVES

(75) Inventors: Eric G. Larson, Lake Elmo, MN (US); Glen Connell, Pine Springs, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 902 days.

(21) Appl. No.: 11/459,091

(22) Filed: Jul. 21, 2006

(65) Prior Publication Data

US 2008/0020157 A1    Jan. 24, 2008

(51) Int. Cl.
- *B32B 27/00* (2006.01)
- *C08K 3/04* (2006.01)
- *C08K 3/08* (2006.01)

(52) U.S. Cl. .................. 428/355 BL; 428/355 CN; 524/440

(58) Field of Classification Search ........... 428/355 EN, 428/355 BL, 355 CN, 473.5; 524/440, 495
See application file for complete search history.

(56) References Cited

U.S. PATENT DOCUMENTS

| | | | |
|---|---|---|---|
| 4,269,961 A * | 5/1981 | Jones et al. ................. 526/262 |
| 4,323,662 A | 4/1982 | Oba et al. |
| 4,920,005 A | 4/1990 | Mercer |
| 5,162,087 A | 11/1992 | Fukuzawa et al. |
| 5,578,697 A * | 11/1996 | Kawamonzen et al. ...... 528/353 |
| 5,928,767 A | 7/1999 | Gebhardt et al. |
| 5,937,166 A | 8/1999 | Fukasawa |
| 6,034,194 A | 3/2000 | Dershem et al. |
| 6,034,195 A | 3/2000 | Dershem et al. |
| 6,039,896 A * | 3/2000 | Miyamoto et al. .......... 252/511 |
| 6,288,209 B1 | 9/2001 | Jensen |
| 6,833,180 B1 | 12/2004 | Kodemura |
| 6,960,636 B2 | 11/2005 | Dershem et al. |
| 2002/0007042 A1 | 1/2002 | Herr et al. |
| 2004/0077798 A1 | 4/2004 | Dershem et al. |
| 2004/0225026 A1 | 11/2004 | Mizori et al. |
| 2004/0225059 A1 | 11/2004 | Mizori et al. |

FOREIGN PATENT DOCUMENTS

| | | |
|---|---|---|
| EP | 0 552 984 A2 | 7/1993 |
| JP | 4-115407 | 4/1992 |
| JP | 6-275682 | 9/1994 |
| JP | 10-140116 | 5/1998 |
| JP | 10-168413 | 6/1998 |
| JP | 11-035903 | 2/1999 |
| JP | 2002-201440 | 7/2002 |
| JP | 2002-285103 | 10/2002 |

* cited by examiner

*Primary Examiner*—Thao T. Tran
(74) *Attorney, Agent, or Firm*—Dean M. Harts; Stephen F. Wolf

(57) ABSTRACT

Provided are adhesive compositions comprising a mixture of a maleimide terminated polyimide resin, a thermoplastic resin compatible with the maleimide terminated polyimide resin, a thermally activated free radical curing agent, and electrically conductive particles and/or scrim. Various embodiments add a silane coupling agent and/or an ethylenically unsaturated compound with acid functionality. Methods of using the compositions also are provided.

19 Claims, No Drawings

ANISOTROPIC CONDUCTIVE ADHESIVES

TECHNICAL FIELD

This disclosure relates to electrically conductive adhesives, including anisotropic conductive adhesives.

BACKGROUND

An adhesive that has the ability to establish multiple, discreet electrical connections between two electrical components is commonly referred to as an anisotropically conductive adhesive. Such adhesives often are used to provide electrical connection between a flexible circuit and an electrical substrate. An anisotropically conductive adhesive composition also should provide a short bond time, adhere to a variety of substrates, provide a bondline without voids, have satisfactory shelf and storage life, and maintain the physical connection between a flexible circuit and an electrical substrate. The anisotropically conductive adhesive composition should also be easy to manufacture and use.

Some anisotropically conductive adhesive compositions have used microencapsulated imidazoles as thermally activated curing agents. These anisotropically conductive adhesive compositions typically have a shelf life of approximately one week at room temperature. Such adhesive compositions are typically complicated to manufacture because solvent needs to be removed without initiating the cure by the imidazole curatives. If the solvent is not removed completely from such adhesive compositions, voids can result in the subsequent bonding operations. Voids in the bondline can reduce the reliability of the electrical connection during use and can also reduce the adhesion strength of the bonded electrical components. If solvent removal is protracted, the shelf life may be reduced due to partial release of the imidazole. If the viscosity in the adhesive composition prior to cure is too low, then voids may occur in the bondline. Increasing the viscosity of the uncured anisotropically conductive adhesive composition and/or using a curative that is operational at a lower temperature are known methods to reduce voids. However, higher viscosity formulations require more solvent and therefore longer steps to remove the solvent completely. Also, if the viscosity is too high, the coating solution may not wet the substrate, resulting in poor adhesion to the substrate. Lower temperature curatives can compromise both shelf stability and the manufacturing process.

Other types of anisotropic conductive adhesives with free-radical cure resins have been suggested in order to provide lower temperature and faster cures. One of the major weaknesses of these systems has been a lack of strong adhesion to a wide variety of flexible circuits.

SUMMARY

This new formulation overcomes one or more of the deficiencies in the prior art, and yet allows short bond times at lower temperatures with universally good adhesion and the desired reliability.

Provided in one embodiment is an adhesive composition comprising a mixture of a maleimide terminated polyimide resin, a thermoplastic resin compatible with the maleimide terminated polyimide resin, a thermally activated free radical curing agent, and electrically conductive particles and/or scrim.

Other embodiments add a silane coupling agent and/or an ethylenically unsaturated compound with acid functionality.

In another embodiment, this disclosure provides a curable adhesive film, tape, or sheet comprising the adhesive composition described above. In another embodiment, this disclosure provides an electronic article comprising a flexible printed circuit and an adhesive composition as described herein adhered to the flexible printed circuit.

In another embodiment, the invention provides an electrical connection comprising a flexible printed circuit, an adhesive composition according to the invention, and an electrical substrate with the flexible printed circuit adhered to the electrical substrate with the adhesive composition according to the invention.

In yet another embodiment, this disclosure provides method for attaching a first article to a second article comprising providing an adhesive composition as described herein on the first article, contacting the second article to the adhesive on the first article to form an assembly wherein the first article and the second article have the adhesive therebetween, and curing the adhesive.

The details of one or more embodiments of the present invention are set forth in the description below. Other features, objects, and advantages of the invention will be apparent from the description including the examples and the claims.

DETAILED DESCRIPTION

"Thermoplastic resin" means a resin that softens when exposed to heating above room temperature (about 25° C.) and returns to its original condition when cooled to room temperature.

"Parts by weight" (pbw) means parts of a resin component per weight of the total amount of maleimide terminated polyimide resin, thermoplastic resin compatible with the maleimide terminated polyimide resin, an ethylenically unsaturated compound with acid functionality (if present), coupling agent and thermally activated free-radical curing agent.

All numbers are herein assumed to be modified by the term "about." The recitation of numerical ranges by endpoints includes all numbers subsumed within that range (e.g., 1 to 5 includes 1, 1.5, 2, 2.75, 3, 3.80, 4, and 5).

The adhesive compositions of the invention advantageously can be used to provide a bond between flexible circuits and electrical components without voids in the bondline, which leads to stable and reliable electrical and adhesion properties. The adhesive compositions of the invention allow the bonds to be formed at low temperatures and with short bonding times. The formulations of one or more embodiments of the present invention overcome the limitations of short shelf life and voids in the bondline.

The maleimide-terminated polyimide resins used in the compositions of the invention may be polyimides prepared from primary aliphatic diamines and dicarboxylic dianhydrides. Dicarboxylic dianhydrides that are useful in the maleimide-terminated polyimide resins of the present invention are dianhydrides such as pyromelitic dianhydride, tetracarboxylic dianhydride benzophenone, and tetracarboxylic dianhydride butane. The polyimides of the present invention are prepared with excess primary aliphatic amines to allow the end groups to be maleimide terminated. Primary aliphatic diamines that are useful in the maleimide-terminated polyimide resins of the present invention are diamines with ten or more carbon atoms. Such diamines are 1,10-decanediamine, 1,12-dodecadiamine and a C-36 primary diamine, such as Versamine 552 (Cognis Corp., Cincinnati, Ohio).

The maleimide-terminated polyimides may be prepared as described in US 2004-0225059. Specific examples of maleimide-terminated polyimides that are usable in the invention are Polyset 9000 and Polyset 4000 available from Designer Molecules, Inc. (San Diego, Calif.).

The maleimide-terminated polyimide resin may be present in the adhesive composition of the invention at an amount of at least 30 pbw. In other embodiments, the adhesive composition of the invention may contain at least about 40 pbw and less than about 60 pbw of this polyimide resin.

Thermoplastic resins compatible with the maleimide-terminated polyimide resins which are useful in the compositions of the present invention include thermoplastic resins which are hydrophobic and are soluble in toluene. By compatible with maleimide-terminated polyimide resins is meant that the thermoplastic resin and the maleimide-terminated polyimide resin are both soluble together in the same solvent, which may be an aromatic solvent. Examples of useful solvents include toluene and xylenes. Examples of thermoplastic resins which are hydrophobic and soluble in toluene are block copolymers of styrene and butadiene. Additional examples of thermoplastic resins which are hydrophobic and soluble in toluene are block copolymers of styrene and isoprene. Other examples of thermoplastic resins which are hydrophobic and soluble in toluene are block copolymers of styrene and combinations of butadiene and isoprene. Styrene and butadiene block copolymers that are useful in the present invention may be diblock copolymers which contain a segment of styrene polymer and a segment of butadiene polymer covalently bonded together. Styrene and butadiene block copolymers that are useful in the present invention may be triblock copolymers which contain two segments of styrene polymer and one segment of butadiene polymer, wherein each of the segments of styrene polymer are covalently bonded to the segment of butadiene polymer. Additional styrene and butadiene block copolymers that are useful in the present invention may be block copolymers of styrene and butadiene wherein the butadiene segment has been hydrogenated.

Additional thermoplastic resins which are useful in the present invention are triblock copolymers with a segment of styrene polymer, a segment of butadiene polymer and a segment of methacrylate ester polymer. The thermoplastic resins useful in the present invention include a polymer segment which includes a reactive double bond. The reactive double bond in the one polymer segment of the thermoplastic resin may react with the maleimide terminated polyimide resin during the free radically activated curing process.

Representative examples of thermoplastic resins compatible with the maleimide terminated polyimide resins include resins available as "Kraton" resins available from Kraton Polymer LLC, Houston, Tex., such as Kraton FG1901X, Kraton DKX 222CS, Kraton D1116K, and Kraton DKX-410CS. Additional representative examples of thermoplastic resins compatible with the maleimide-terminated polyimide resins include styrene-butadiene-methacrylate resins such as SBM AFX233 and SBM AFX123, available from Arkema Inc., Philadelphia, Pa.

The thermoplastic resins may be present in the adhesive composition of the invention at an amount that is greater than 30 pbw. Preferably the thermoplastic resin may be present in the adhesive composition of the invention at an amount greater than 40 pbw and less than 65 pbw.

An ethylenically-unsaturated oligomer, which may be a liquid acrylic oligomer, also can be included in these adhesive compositions. These liquid acrylates can provide tackiness to a layer of an adhesive composition coated onto a substrate such as a release liner. Generally, such materials are included in an amount sufficient to provide room temperature tackiness such that the adhesive remains where placed during alignment and assembly, until cured or mechanically held before curing. This adhesion level in some embodiments is sufficient to label the adhesive composition as pressure sensitive at room temperature. Generally the tack level is low in most embodiments; for example, even below about 1 N/cm. Preferably, such materials are included in an amount up to about 20 pbw. In other embodiments, this amount is at least about 5 pbw, and in some embodiments about 8 to 12 pbw. In other embodiments, the amount is limited to about 20 pbw to prevent incompatibility with the overall composition. Useful materials in this category include, for example, acrylic oligomers, polyester-acrylates, urethane-acrylates, and epoxy-acrylates. Commercial materials include, for example, difunctional bisphenol-A-based epoxy acrylate (CN120 from Sartomer), partially acrylated bisphenol-A epoxy diacrylate (Ebecryl 3605), and bisphenol-A epoxy diacrylates (Ebecryl 37XX Series) (Ebecryl materials are from Cytec Industries).

As used herein, ethylenically unsaturated compounds with acid functionality is meant to include monomers, oligomers, and polymers having ethylenic unsaturation and acid functionality.

Ethylenically unsaturated compounds with acid functionality include, for example, $\alpha,\beta$-unsaturated acidic compounds such as glycerol phosphate mono(meth)acrylates, glycerol phosphate di(meth)acrylates, hydroxyethyl (meth) acrylate (e.g., HEMA) phosphates, bis((meth)acryloxyethyl) phosphate, ((meth)acryloxypropyl) phosphate, bis((meth) acryloxypropyl) phosphate, bis((meth)acryloxy)propyloxy phosphate, (meth)acryloxyhexyl phosphate, bis((meth)acryloxyhexyl) phosphate, (meth)acryloxyoctyl phosphate, bis ((meth)acryloxyoctyl) phosphate, (meth)acryloxydecyl phosphate, bis((meth)acryloxydecyl) phosphate, caprolactone methacrylate phosphate, citric acid di- or tri-methacrylates, poly(meth)acrylated oligomaleic acid, poly(meth)acrylated polymaleic acid, poly(meth)acrylated poly(meth) acrylic acid, poly(meth)acrylated polycarboxyl-polyphosphonic acid, poly(meth)acrylated polysulfonate, poly(meth)acrylated polyboric acid, and the like, may be used as components in the adhesive compositions. Monomers, oligomers, and polymers of unsaturated carbonic acids such as (meth)acrylic acids, aromatic (meth)acrylated acids (e.g., methacrylated trimellitic acids) also can be used.

Specific examples of ethylenically unsaturated compound with acid functionality, if present, which are useful in the compositions of the present invention include 6-methacryloyloxyhexyl phosphate and acid functionalized acrylic resins such as Ebecryl 170 (from Cytec) and Photomer 4173 (from Cognis).

The ethylenically unsaturated compounds with acid functionality, if present, may be used in the adhesive composition of the invention at an amount (pbw) that does not undesirably retard the cure time, for example, a level up to about 5 pbw, and in some embodiments at least about 0.01, 0.03, 0.05, 1, or even more.

Coupling agents compatible with, or participating in, a free-radical curing reaction with the other components of this invention also can be used. Examples include a mercapto silane system, acrylic systems, gamma-mercapto propyltrimethoxysilane, gamma-methacryloxpropyl trimethoxy silane, gamma-aminopropyltrimethoxysilane, and vinyltrimethoxysilane. These materials are especially useful for certain embodiments, e.g, those intended for glass substrates, such as ITO-coated glass for LCD applications.

The coupling agents may be used in the adhesive composition of the invention at an amount that is up to about 3 pbw, and in other embodiments, from about 0.01 pbw to 1.0 pbw. For example, good results for coated glass substrates may use around 0.02 pbw.

Examples of useful thermal initiators include but are not limited to those selected from the group consisting of azo compounds such as 2,2-azo-bisisobutyronitrile, dimethyl 2,2'-azobis-isobutyrate, azo-bis-(diphenyl methane), 4-4'-azobis-(4-cyanopentanoic acid); peroxides such as benzoyl peroxide, cumyl peroxide, tert-butyl peroxide, cyclohexanone peroxide, glutaric acid peroxide, lauroyl peroxide, hydrogen peroxide, hydroperoxides such as tert-butyl hydroperoxide and cumene hydroperoxide, peracids such as peracetic acid and perbenzoic acid, potassium persulfate, and peresters such as diisopropyl percarbonate.

The electrically conductive particles used may be conductive particles such as carbon particles or metal particles of silver, copper, nickel, gold, tin, zinc, platinum, palladium, iron, tungsten, molybdenum, alloys thereof, solder, or the like, or particles prepared with a surface covering or coating of a conductive coating of a metal, alloy, or the like. It is also possible to use non-conductive particles of a polymer such as polyethylene, polystyrene, phenol resin, epoxy resin, acryl resin or benzoguanamine resin, or glass beads, silica, graphite or a ceramic, whose surfaces have been covered with a conductive coating (e.g., a metal, alloy, or the like).

The electrically conductive particles are found in a variety of shapes (e.g., spherical, ellipsoidal, cylindrical, flakes, needle, whisker, platelet, agglomerate, crystal, acicular). The particle may have a slightly rough or spiked surface. The shape of the electrically conductive particles is not particularly limited but a nearly spherical shape is preferred in some embodiments. The choice of shape is typically dependent upon the rheology of the selected resin components and ease of processing of the final resin/particle mix. Combinations of particle shapes, sizes, and hardness may be used in the compositions of the invention.

In other embodiments, the adhesive composition of this disclosure also can be used for adhesives conductive through the thickness as well as in the plane, also called isotropic adhesives. Any known means for achieving isotropic conductive adhesives, such as the inclusion of conductive scrim, carbon fibers, and/or elongated particles, can be used. Of course, loading the adhesive with particles, fibers, and/or scrim can reduce adhesion to various substrates. The adhesive compositions of various embodiments of this disclosure allow desirable conductivity levels while providing desirable adhesion levels.

The mean particle size of the conductive particles used may vary depending on the electrode width and the spacing between the adjacent electrodes used for connection. For example, if the electrode width is 50 micrometers (μm) and the spacing between adjacent electrodes is 50 μm (that is, the electrode pitch is 100 μm), a mean particle size of about 3 to about 20 μm is appropriate. By using an anisotropically conductive adhesive composition in which are dispersed conductive particles with a mean particle size in this range, it is possible to achieve fully satisfactory conductive characteristics while also adequately preventing short circuiting between adjacent electrodes. In most cases, since the pitch of the electrodes used for connection between the two circuit substrates will be from about 50 to about 1000 μm, the mean particle size of the conductive particles is preferably in the range of about 2 to about 40 micrometers. If they are smaller than about 2 μm, they may be buried in pits in the electrode surface thus losing their function as conductive particles, and if they are larger about 40 μm, they may tend to produce short circuiting between adjacent electrodes.

The amount of the conductive particles added may vary depending on the area of the electrodes used and the mean particle size of the conductive particles. A satisfactory connection can usually be achieved with a few (for example, about 2 to about 10) conductive particles present per electrode. For even lower electrical resistance, the conductive particles may be included in the composition at about 10 to about 300 per electrode.

The amount of conductive particles with respect to the total volume of the dry composition (that is without solvent) minus the conductive particles (all in volume percent or vol. %) is usually at least about 0.1, in other embodiments at least about 0.5, 1, or even at least about 5. In other embodiments, the amount of conductive particles is below about 30, below about 20, below about 10, or even lower (again, all in vol. %). In one presently preferred embodiment, this amount ranges from about 0.5 to about 10 vol. %.

Adjuvants may optionally be added to the compositions such as colorants, antioxidants, flow agents, bodying agents, flatting agents, inert fillers, binders, fungicides, bactericides, surfactants, plasticizers, and other additives known to those skilled in the art. They can be also substantially unreactive, such as fillers both inorganic and organic. These adjuvants, if present, are added in an amount effective for their art known purpose.

Typically, the adhesive composition of the invention will be solvent coated onto a release liner and used as a transfer adhesive film such that the adhesive film can be adhered to a substrate and the liner removed. A typical use for the anisotropically conductive adhesives described in certain embodiments herein is to provide a connection between a flexible printed circuit and a circuit board, for example those found in a flat panel display. Other applications include flipchip attachment of semiconductor chips to various printed circuit substrates and interconnections between two flexible printed circuits or any combinations thereof. Suitable substrates useful to provide articles of the invention include, for example, metals (for example, aluminum, copper, cadmium, zinc, nickel, gold, platinum, silver), glass, various polymeric thermoplastic or thermoset films (for example, polyethylene terephthalate, plasticized polyvinyl chloride, polypropylene, polyethylene, polyimide), FR-4, ceramics, cellulosics, such as cellulose acetate, and epoxides (e.g., circuit boards).

The amount of heat required for polymerization and the amount of the curing agent used will vary depending on the particular polymerizable composition used and the desired application of the polymerized product. Suitable sources of heat to cure the compositions of the invention include induction heating coils, hot bar bonders, ovens, hot plates, heat guns, IR sources including lasers, microwave sources, and the like.

In some embodiments, the adhesive composition of the present disclosure is curable in a time/temperature combination selected from a bond time below about 10 seconds using a temperature below about 200° C., a bond time below about 5 seconds using a temperature below about 200° C., and a bond time below about 10 seconds using a temperature below about 170° C. In other embodiments, the adhesive composition of the present disclosure is curable using a bond time (in seconds) of below about 10, below about 8, below about 5, or even faster. In other embodiments, the adhesive composition of the present disclosure is curable using a bond temperature (° C.) of below about 200, below about 175, below about 170, below about 150, or even lower.

In some embodiments, the adhesive composition of the present disclosure is stable at room temperature for at least about 1 week, at least about 2 weeks, at least about 3 or 4 weeks, or even longer. Of course, reducing the temperature from room temperature (about 25° C.) can increase the shelf life. In some embodiments, the adhesive compositions of this disclosure provide about four weeks of storage life at room temperature and yet are reactive enough to cure in about 10 seconds in a bonding cycle with a maximum adhesive temperature of about 150° C.

These adhesive compositions can be used in any known method. For example, one method involves attaching a first article to a second article comprising providing the adhesive composition as described herein on the first article, contacting the second article to the adhesive on the first article to form an assembly wherein the first article and the second article have the adhesive therebetween, and curing the adhesive. Heat and pressure typically are used with the anisotropic embodiments. Electronic devices, such as liquid crystal display components, can be selected for one of these articles while circuitry, such as flexible circuitry, is selected for the other article. Generally, the adhesive compositions disclosed herein are used to provide electrical communication between the articles.

Microelectronic devices contemplated for use with the adhesive compositions disclosed include, e.g., flex circuits bonded to another flex circuit, glass, semiconductor die, chip, circuit board, etc., and other examples include bonding semiconductor die to glass, chip, circuit board, etc.

In some embodiments, the adhesive compositions after curing and aging for 1000 hours at 85° C./85% relative humidity maintain stable adhesion levels (as measured by peel testing) and maintain low electrical resistance.

Advantages of this invention are further illustrated by the following examples, and the particular materials and amounts thereof recited in these examples, as well as other conditions and details, should not be construed to unduly limit this invention. All materials are commercially available or known to those skilled in the art unless otherwise stated or apparent.

EXAMPLES

In the test methods and examples below, the sample dimensions are approximate. Materials were available from chemical supply houses such as Aldrich, Milwaukee, Wis., Sigma-Aldrich, St. Louis, Mo., or also as specified below. All material percentages below are reported in weight percent.

Test Methods

Peel Adhesion

Strips of adhesive film (5 mm by 25 mm) were cut from larger samples of each adhesive film. Adhesive film samples were used to bond three different types of flex circuits to Indium-Tin Oxide-coated (ITO-coated) glass substrates. The different types of flex were: (1) adhesive-type polyimide flex (available from Flexible Circuit Technologies, Inc., Minneapolis, Minn.) (2) 3M Brand Adhesiveless Flexible Circuits, (3) Sony Chemical Hyperflex™, which is described as a two-layer adhesiveless structure of polyimide and copper foil. The flex circuit samples were bonded to the ITO-coated glass with a MicroJoin 4000 pulse heat bonder (MicroJoin Inc., now Miyachi Unitek Corp., Monrovia, Calif.) with a bar temperature of 300 degrees Centigrade, a pressure of 3 MPa and a bond time of 10 seconds. The bonded samples were tested for 90 degree peel adhesion using an INSTRON 1122 Tensile Tester upgraded with MTS RENEW software, both available from MTS Systems Corp., Eden Prairie, Minn., The tensile tester was fitted with a 22.7 kg load cell, and a 90 degree peel test fixture. The peel rate was 25 mm/minute. The peak peel force value was recorded. One to three replicates were tested for each test composition. The peak peel force values of the replicates were averaged and are reported below in Table 2.

Electrical Resistance Test

Adhesive films samples (5 mm by 25 mm) were used to bond 200 μm pitch gold adhesive-less flex circuits and corresponding FR-4 circuit test boards. The samples were bonded using a MicroJoin 4000 pulse heat bonder with a pressure of 3 MPa and a bar temperature and a bonding time set to achieve the same bondline temperature, measured with a thermocouple, as achieved in the preparation of the peel adhesion test samples. The Electrical resistance of the bonded samples was determined using a 4-Point Kelvin Measurement technique using the following components/settings:

Power source/voltmeter: Model 236 Source-Measure Unit, available from Keithley Instruments, Inc., Cleveland, Ohio Switching matrix: Integra Series Switch/Control Module Model 7001, available from Keithley Instruments, Inc.

Probe station: Circuit Check PCB-PET, available from Circuit Check Inc, Maple Grove, Minn.

PC software: LabVIEW (National Instruments, Austin, Tex.)

Test current: 100 milliamps (mA)

Sense compliance (volts): 2.000

The bonded samples were placed in the probe station, and 15 measurements were taken on each sample. The average of these measurements is reported in the tables below.

Voids

A visual observation using about 40× magnification was used. A rating of 1 means voids were present in nearly every trace, 2 means a few small voids were observed in some of the traces, and 3 means no voids were observed.

Materials Used

| Trade Designation/ Material | Source | Description |
|---|---|---|
| CN 120 | Sartomer Company, (Exton, PA) | Epoxy - Acrylate |
| SBM AFX233 | Arkema Inc., (Philadelphia, PA) | Styrene-Butadiene-Methylmethacrylate block copolymer |
| SBM AFX123 | Arkema Inc., | Styrene-Butadiene-Methylmethacrylate block copolymer |
| Luperox A75 | Arkema Inc., | 75% benzoyl peroxide in water |
| Z-6030 | Dow Corning Corp., (Midland, MI) | 3-methacryloylpropyltriethoxysilane |
| Polyset 4000 | Designer Molecules Inc., | Maleimide terminated polyimide resin |

-continued

| Trade Designation/Material | Source | Description |
|---|---|---|
| Polyset 9000 | (San Diego, CA) Designer Molecules Inc. | (~4000 MW) Maleimide terminated polyimide resin (~9000 MW) |
| Kraton FG1901X | Kraton Polymers LLC, (Houston, TX) | Styrene-Ethylene-Butylene-Styrene block copolymer with grafted maleic anhydride |
| Kraton DKX 222CS | Kraton Polymers LLC | Styrene-butadiene-styrene block copolymer |
| InChemRez PKHH | InChem Corp., (Rock Hill, SC) | Solid phenoxy resin |
| Ebecryl 170 | Cytec Industries Inc., (West Patterson, NJ) | Acid functional acrylate |
| 7GNM8-NiC | JCI USA Inc., White (Plains, NY) | 7% gold-coated nickel particles, average mean size 8 μm |

EXAMPLES

The following adhesive coating solutions were prepared and were used to prepare films by the general procedure as follows. The components listed in the table below were combined in a small jar and mixed with an air driven mixer fitted with a high shear blade for approximately five minutes. The solution was degassed by placing the jar in a vacuum chamber at ambient temperature until bubbling stopped. The degassed solution was spread on a silicone treated polyethylene terephthalate (PET) film using a knife coater. The coated solution was dried for 7 minutes in a forced air oven set at 65° C. The dried adhesive film thickness was about 40 μm.

An ethylenically unsaturated compound with acid functionality, 6-Methacryloxyhexyl Phosphate (MHP), was prepared as follows. 6-Hydroxyhexyl Methacrylate Synthesis: 1,6-hexanediol (1000.00 g, 8.46 mol, Sigma-Aldrich) was placed in a 1-liter 3-neck flask equipped with a mechanical stirrer and a narrow tube blowing dry air into the flask. The solid diol was heated to 9° C., at which temperature all the solid melted. With continuous stirring, p-toluenesulfonic acid crystals (18.95 g, 0.11 mol) followed by butylated hydroxytoluene (BHT) (2.42 g, 0.011 mol) and methacrylic acid (728.49 g, 8.46 mol). Heating at 90° C. with stirring was continued for 5 h during which time vacuum was applied using tap water aspirator for 5-10 minutes after each half-hour reaction time. The heat was turned off and the reaction mixture was cooled to room temperature. The viscous liquid obtained was washed with 10% aqueous sodium carbonate twice (2×240 mL), followed by washing with water (2×240 mL), and finally with 100 mL of saturated NaCl aqueous solution. The obtained oil was dried using anhydrous $Na_2SO_4$ then isolated by vacuum filtration to give 1067 g (67.70%) of 6-hydroxyhexyl methacrylate, a yellow oil. This desired product was formed along with 15-18% of 1,6-bis(methacryloyloxyhexane). Chemical characterization was by NMR analysis.

6-Methacryloxyhexyl Phosphate Synthesis: A slurry was formed by mixing $P_2O_5$ (178.66 g, 0.63 mol) and methylene chloride (500 mL) in a 1 L flask equipped with a mechanical stirrer under $N_2$ atmosphere. The flask was cooled in an ice bath (0-5° C.) for 15 minutes. With continuous stirring, 6-hydroxyhexyl methacrylate (962.82 g, which contained 3.78 mol of the mono-methacrylate, along with its dimethacrylate by-product as described above) was added to the flask slowly over 2 h. After complete addition, the mixture was stirred in the ice bath for 1 h then at room temperature for 2 h. BHT (500 mg) was added, and then the temperature was raised to reflux (40-41° C.) for 45 minutes. The heat was turned off and the mixture was allowed to cool to room temperature. The solvent was removed under vacuum to afford 1085 g (95.5%) of 6-Methacryloxyhexyl Phosphate (MHP-B) as a yellow oil. Chemical characterization was by NMR analysis.

In the table below, when a material is followed by a solvent, it was 25% of the material mixed with 75% solvent. For example, "SBM AFX233/MEK" means 25 weight percent SBM AFX233 in 75 weight % methyl ethyl ketone.

TABLE 1

| Component (g) | Example Content | | | | | | | | | | | |
|---|---|---|---|---|---|---|---|---|---|---|---|---|
| | Example (or Comparative Example CE) | | | | | | | | | | | |
| | 1 | 2 | 3 | 4 | 5 | 6 | 7 | 8 | 9 | 10 | 11 | CE 1 |
| CN 120 | — | — | — | — | — | — | — | — | — | — | — | 2.1 |
| SBM AFX233/MEK | — | — | — | — | — | — | — | — | — | — | — | 4.56 |
| SBM AFX233/toluene | — | — | — | — | — | 12 | — | — | — | — | — | — |
| SBM AFX123/toluene | — | — | — | — | — | — | 24 | — | — | 23.6 | — | — |
| DKX222 CS/Toluene | — | — | — | — | — | — | — | 24 | — | — | — | — |

TABLE 1-continued

| Component (g) | Example Content Example (or Comparative Example CE) | | | | | | | | | | | |
|---|---|---|---|---|---|---|---|---|---|---|---|---|
| | 1 | 2 | 3 | 4 | 5 | 6 | 7 | 8 | 9 | 10 | 11 | CE 1 |
| Luperox A75 | 0.08 | 0.13 | 0.13 | 0.13 | 0.13 | 0.13 | 0.13 | 0.13 | 0.13 | 0.13 | 0.13 | 0.08 |
| Ebecryl 170 | — | — | — | — | — | — | — | — | 0.1 | 0.1 | 0.1 | — |
| MHP | 0.06 | — | 0.05 | — | 0.1 | 0.1 | 0.1 | 0.1 | — | — | 0.1 | 0.06 |
| Z-6030 | 0.02 | 0.02 | 0.02 | 0.02 | 0.02 | 0.02 | 0.02 | 0.02 | 0.02 | 0.02 | | 0.06 |
| Polyset 9000 | 2.4 | 4 | 4.98 | 6 | 4 | 4 | 4 | 4 | 4 | 4 | | — |
| Polyset 4000 | — | — | — | — | — | — | — | — | — | — | 4 | |
| Kraton FG1901X/toluene | 11.8 | 24 | 19.9 | 16 | 23.6 | 12 | — | — | 23.6 | — | 23.6 | — |
| InChemRez PKHH/MEK | — | — | — | — | — | — | — | — | — | — | — | 10.8 |
| 7GNM8-NiC | 1 | 1.6 | 1.6 | 1.6 | 1.6 | 1.6 | 1.6 | 1.6 | 1.6 | 1.6 | 1.6 | 1 |
| Toluene | 2.5 | 2.5 | 2.5 | 2.5 | 2.5 | 2.5 | 2.5 | 2.5 | 2.5 | 2.5 | 2.5 | — |
| MEK | — | — | — | — | — | — | — | — | — | — | — | 5.9 |

TABLE 2

Peak Peel force, N/cm

| | Adhesive-type polyimide | Sony Chemical Hyperflex | 3M Adhesiveless Flexible Circuit |
|---|---|---|---|
| Example 1 | 13.18 | 23.15 | 14.44 |
| CE-1 | 14.64 | 5.49 | 6.77 |

TABLE 3

Peak Peel Force and Electrical Resistance for Example 1 Material

| | Bar Set Temp. (° C.) | Bondline Temp. (Maximum) (° C.) | Bond Time (seconds) | Peel Results (N/cm) | Electrical Resistance (milliohms) |
|---|---|---|---|---|---|
| Example 1 | 270 | 170 | 5 | >9.8 | <20 |
| Example 1 | 240 | 150 | 10 | >9.8 | <20 |

TABLE 4

Test Results for Examples 2-11

| Example Number | Peel Force (N/cm) 3 M Adhesive-less Flexible Circuits | Peel Force (N/cm) Hyperflex | Electrical Resistance (milliohms) | Voids |
|---|---|---|---|---|
| 2 | 13.5 | — | 17.6 | 3 |
| 3 | 15.7 | — | 11.9 | 3 |
| 4 | 10.1 | — | 21.6 | 2 |
| 5 | 15.0 | — | 8.1 | 3 |
| 6 | 12.9 | 15.1 | 7.8 | 3 |
| 7 | 12.9 | 12.9 | 6.5 | 3 |
| 8 | 11.4 | 14.5 | 4.5 | 3 |
| 9 | 20.1 | — | 6.7 | 3 |
| 10 | 13.9 | — | 7.4 | 3 |
| 11 | 9.1 | — | 10.2 | 2 |

In the tables above, "—" means a property was not measured. Generally, a peel force of at least about 7 N/cm is desirable on two or more commonly-used substrates. In some embodiments, a peel force of at least about 10 N/cm is desirable on two or more commonly-used substrates.

Foreseeable modifications and alterations of this invention will be apparent to those skilled in the art without departing from the scope and spirit of this invention. This invention should not be restricted to the embodiments that are set forth in this application for illustrative purposes.

What is claimed is:

1. An adhesive composition comprising a mixture of:
   a maleimide terminated polyimide resin;
   a styrene-containing thermoplastic resin compatible with the maleimide terminated polyimide resin;
   optionally, a silane coupling agent;
   optionally, an ethylenically unsaturated compound with acid functionality;
   a thermally activated free radical curing agent; and
   at least one of an electrically conductive scrim, carbon fibers, electrically conductive particles, or combinations thereof,
   wherein the maleimide terminated polyimide resin comprises a reaction product of a primary aliphatic diamine having ten or more carbon atoms with a tetracarboxylic dianhydride followed by reaction with maleic anhydride, and
   wherein the styrene-containing thermoplastic resin and the maleimide terminated polyimide resin are both soluble together in an aromatic solvent.

2. The adhesive composition of claim 1 wherein the aromatic solvent comprises toluene, xylenes, or a combination thereof.

3. The adhesive composition of claim 1 wherein the maleimide terminated polyimide resin comprises a reaction product of a C-36 aliphatic diamine with a tetracarboxylic dianhydride.

4. The adhesive composition of claim 1 further comprising an acrylic oligomer.

5. The adhesive composition of claim 1 wherein the thermally activated curing agent is benzoyl peroxide or lauroyl peroxide.

6. The adhesive composition of claim 1 wherein the adhesive, after curing, provides a peel force of at least about 10 N/cm when peeling from at least two of adhesive-type polyimide film, adhesive-less polyimide film, and FR-4 circuit board.

7. The adhesive composition of claim 1 having a shelf life of at least about 4 weeks at room temperature.

8. The adhesive composition of claim 1 wherein the adhesive is curable at a temperature selected from below about 200° C., below about 170° C., and below about 150° C.

9. The adhesive composition of claim 1 wherein the adhesive is curable at a temperature below about 200° C. coupled with a bond time selected from below about 10 seconds, below about 8 seconds, and below about 5 seconds.

10. A curable adhesive film comprising the adhesive composition of claim 1.

11. An anisotropic curable adhesive film comprising the adhesive composition of claim 1.

12. The curable adhesive film according to claim 11 wherein the adhesive film has a thickness of from about 5 to about 100 micrometers.

13. A tape comprising the curable adhesive film of claim 11 on a liner.

14. An electronic article comprising a flexible printed circuit and the adhesive composition according to claim 1 adhered to the flexible printed circuit.

15. A liquid-crystal display panel comprising an ITO-coated glass adhered to the adhesive of claim 1.

16. A method for attaching a first article to a second article comprising:
   providing an adhesive composition according to claim 1 on the first article;
   contacting the second article to the adhesive on the first article to form an assembly wherein the first article and the second article have the adhesive therebetween; and
   curing the adhesive.

17. The method of claim 16 wherein the first article is a flexible circuit or an LCD panel.

18. The method of claim 16 wherein one of the first article and the second article is a circuit and the other is an electronic device.

19. The method of claim 16 further comprising an electrical pathway between the first article and the second article through the adhesive.

* * * * *

UNITED STATES PATENT AND TRADEMARK OFFICE
CERTIFICATE OF CORRECTION

| | | |
|---|---|---|
| PATENT NO. | : 7,691,475 B2 | Page 1 of 1 |
| APPLICATION NO. | : 11/459091 | |
| DATED | : April 6, 2010 | |
| INVENTOR(S) | : Eric George Larson | |

It is certified that error appears in the above-identified patent and that said Letters Patent is hereby corrected as shown below:

Column 9,
Line 39, delete "9° C.," and insert --90° C.,-- therefor.

Signed and Sealed this
Second Day of August, 2011

David J. Kappos
*Director of the United States Patent and Trademark Office*